(12) United States Patent
Chrysler et al.

(10) Patent No.: US 7,397,119 B2
(45) Date of Patent: Jul. 8, 2008

(54) WAFER-LEVEL DIAMOND SPREADER

(75) Inventors: Gregory M. Chrysler, Chandler, AZ (US); Chuan Hu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/295,623

(22) Filed: Dec. 6, 2005

(65) Prior Publication Data

US 2006/0084197 A1   Apr. 20, 2006

Related U.S. Application Data

(62) Division of application No. 10/876,511, filed on Jun. 24, 2004, now Pat. No. 7,012,011.

(51) Int. Cl.
    *H01L 23/34* (2006.01)
(52) U.S. Cl. ............... 257/720; 257/E23.101
(58) Field of Classification Search ................ 438/460; 257/706, 707, 720, E23.202
    See application file for complete search history.

(56) References Cited

U.S. PATENT DOCUMENTS

| 5,294,381 | A | * | 3/1994 | Iguchi et al. ............ 264/400 |
| 6,030,885 | A | * | 2/2000 | Bothra .................... 438/460 |
| 6,333,522 | B1 | * | 12/2001 | Inoue et al. ............. 257/99 |
| 6,451,120 | B1 | * | 9/2002 | Hubbard et al. ......... 118/719 |
| 6,984,888 | B2 | * | 1/2006 | Sung ...................... 257/720 |

* cited by examiner

*Primary Examiner*—W. David Coleman
(74) *Attorney, Agent, or Firm*—Blakely, Sokoloff, Taylor & Zafman LLP

(57) ABSTRACT

An embodiment of the present invention is a technique to heat spread at wafer level. A silicon wafer is thinned. A chemical vapor deposition diamond (CVDD) wafer processed. The CVDD wafer is bonded to the thinned silicon wafer to form a bonded wafer. Metallization is plated on back side of the CVDD wafer. The CVDD wafer is reflowed to flatten the back side.

20 Claims, 5 Drawing Sheets

WAFER-LEVEL DIAMOND SPREADER

CROSS-REFERENCES TO RELATED APPLICATIONS

This is a Divisional Application of U.S. patent application Ser. No. 10/876,511, filed Jun. 24, 2004. This Divisional Application claims the benefit of the U.S. patent application Ser. No. 10/876,511, now U.S. Pat. No. 7,012,011 B2 issued Mar. 14, 2006.

BACKGROUND

1. Field of the Invention

Embodiments of the invention relate to the field of semiconductor, and more specifically, to thermal design.

2. Description of Related Art

The next generation of mobile processors for wireless devices such as personal digital assistants (PDAs), cellular phones, mobile computers, etc. require efficient thermal management. As processor operating frequency increases due to high performance requirements, thermal design for processors operating at high frequencies has become a challenge.

Existing techniques to address the problem of thermal design have a number of disadvantages. One technique uses an integrated heat spreader (IHS) using polycrystalline diamond which is integrated with the device. This technique is slow and costly because the growth of polycrystalline diamond is slow and the amount of diamond needed is large.

BRIEF DESCRIPTION OF THE DRAWINGS

The embodiments of invention may best be understood by referring to the following description and accompanying drawings that are used to illustrate embodiments of the invention. In the drawings.

DESCRIPTION

An embodiment of the present invention is a technique to heat spread at the wafer level. A silicon wafer is fabricated with circuits, partial interconnect structure, and bumps. It is then thinned. A chemical vapor deposition diamond (CVDD) wafer is processed. The CVDD wafer is bonded to the backside of thinned silicon wafer to form a bonded wafer. Metallization is deposited (e.g., via sputtering and plating) on back side of the CVDD wafer. The CVDD wafer is reflowed or polished to flatten the back side.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, a method of manufacturing or fabrication, etc.

One embodiment of the invention is a technique to provide an electronic package comprising a thinned die with a chemical vapor deposition diamond (CVDD) spreader of the same dimension, and a wafer-level packaging process of diamond spreader. The advantages of the package include reduced cost, small form factor, and very good thermal performance gain. The technique is particularly useful for mobile and/or handheld processors.

Figure 1:
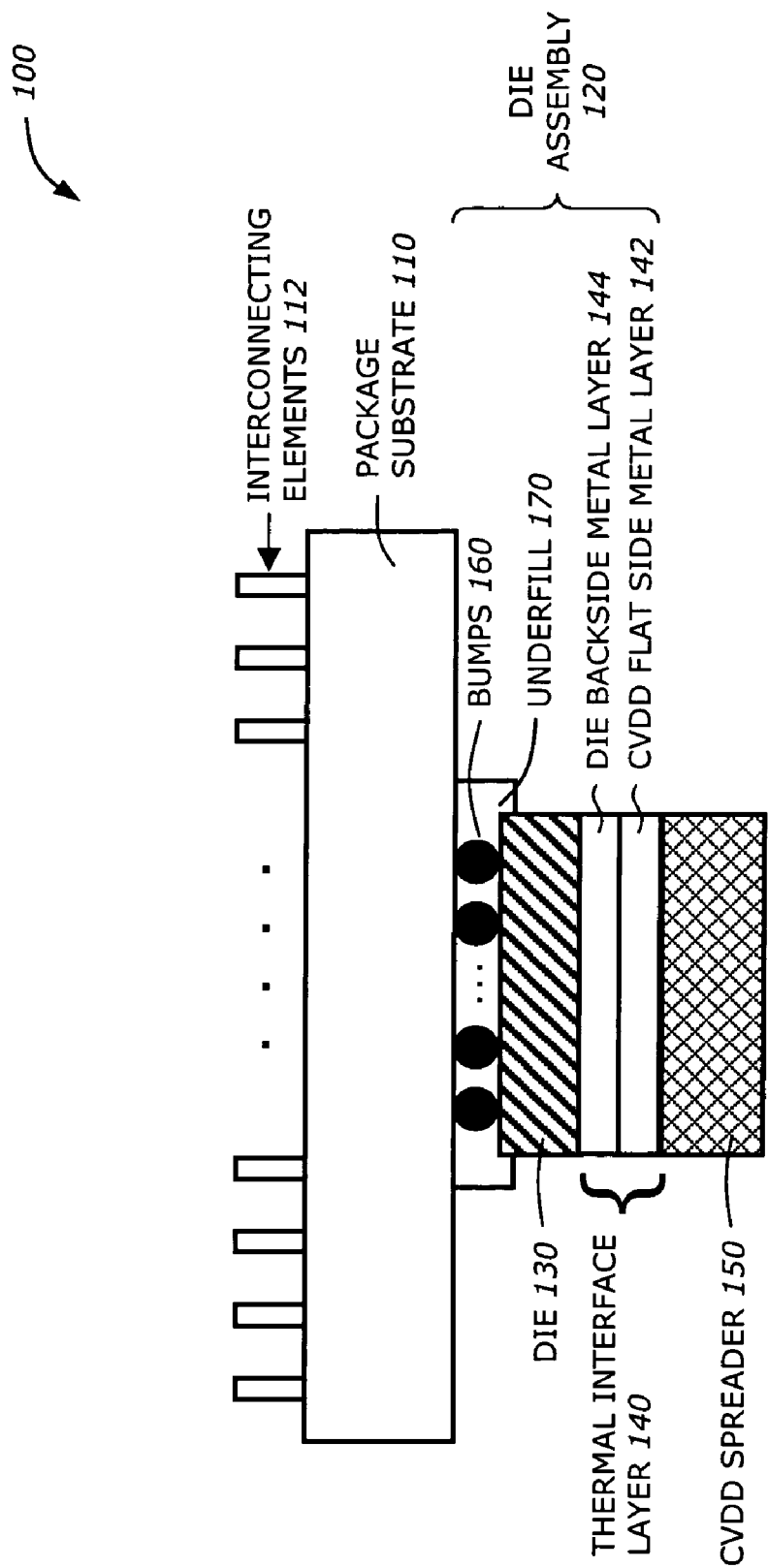
FIG. 1 is a diagram illustrating a device in which one embodiment of the invention can be practiced.

FIG. 1 is a diagram illustrating a device 100 in which one embodiment of the invention can be practiced. The device 100 includes a package substrate 110 and a die assembly 120.

The package substrate 110 is any suitable substrate for packaging. It may be a ceramic substrate or an organic substrate. The package substrate 110 has interconnecting elements 112 to attach the device to a printed circuit board (PCB). Any suitable device packaging technique may be used including Ball Grid Array (BGA), Pin Grid Array (PGA), flip chip technology, etc.

The die assembly 120 includes a die 130, a thermal interface layer 140, and a CVDD spreader 150. Since they are fabricated and bonded at the wafer level and later singulated, the CVDD spreader 150, the thermal interface layer 140, and the die 130 have the same surface dimension. This provides an efficient thermal dissipation and a low cost fabrication process. The die assembly 120 is attached to the package substrate 110 via a plurality of bumps 160 attached to the front side of the die 130. Underfill 170 may be used to provide sealing, encapsulation, or protection for the attachment of the die assembly 120 to the package substrate 110.

The die 130 includes a semiconductor chip or an integrated circuit. In one embodiment, the die 130 is a processor used in mobile or handheld applications. Its thickness may range from 50 μm to 125 μm. As is known by one skilled in the art, other thicknesses may also be used.

The thermal interface layer 140 is on the die backside and provides thermal interface between the die 130 and the CVDD spreader 150. Its thickness may range from 5 μm to 10 μm. It is contemplated that other thicknesses suitable for fabrication may also be used. It essentially includes two layers: a CVDD flat side metal layer 142 and a die backside metal layer 144. The CVDD flat side metal layer 142 is deposited on the CVDD spreader 150 during the fabrication process of a CVDD wafer from which the CVDD spreader 150 is singulated. The die backside metal layer 144 is deposited on the backside of the die 130. The die backside metal layer 144 and the CVDD flat side metal layer 142 have matched coefficients of thermal expansion (CTEs) and are bonded together at the wafer level.

The CVDD spreader 150 is bonded to the die 130 via the thermal interface layer 140. It provides heat spreading or thermal dissipation for the die 130. The CVDD spreader 150 and the die 130 are bonded together at the wafer level before singulation or dicing. Therefore, the CVDD spreader 150 has the same size or dimension as the die 130, leading to efficient heat spreading. In addition, the process is cost effective.

Figure 2:
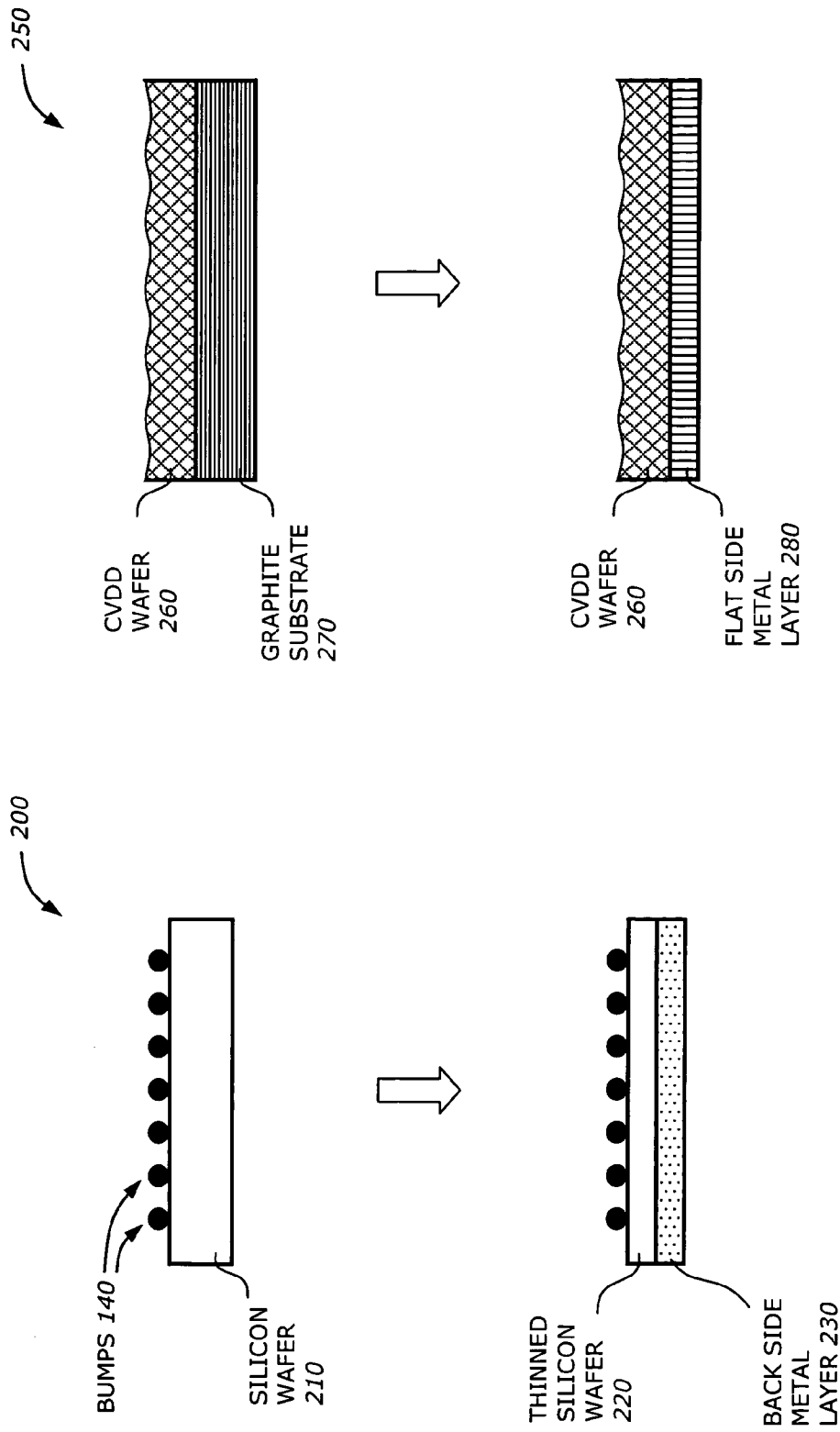
FIG. 2A is a diagram illustrating a silicon wafer according to one embodiment of the invention.
FIG. 2B is a diagram illustrating a chemical vapor deposition diamond (CVDD) wafer according to one embodiment of the invention.

FIG. 2A is a diagram illustrating a silicon wafer 200 according to one embodiment of the invention. The silicon wafer 200 includes a processed silicon wafer 210 and the plurality of bumps 140.

The processed silicon wafer 210 is a silicon wafer that is processed in accordance to traditional circuit fabrication processing. Typical processing stages are performed depending on the applications and designs. For example, the processing stages may include photo masking, etching, diffusion, ion implantation, metal deposition, and passivation.

The processed silicon wafer 210 is then thinned on the backside to become a thinned silicon wafer 220. Any suitable thinning technique may be used such as mechanical grinding, chemical mechanical polishing (CMP), wet etching and atmospheric downstream plasma (ADP), and dry chemical etching (DCE). The thickness of the thinned silicon wafer 220 may range from 50 µm to 125 µm. Thereafter, a backside metal layer 230 is formed by depositing appropriate metallization materials with suitable thicknesses. In one embodiment, the backside metal layer includes titanium (Ti) layer (100 nm), nickel vanadium (NiV) layer (400 nm), and gold (Au) layer (100 nm). It is contemplated that other materials and different thicknesses may be used. When the silicon wafer is singulated into die as will be explained later, the backside metal layer 230 becomes the die backside metal layer 144 shown in FIG. 1.

FIG. 2B is a diagram illustrating a chemical vapor deposition diamond (CVDD) wafer 250 according to one embodiment of the invention. The CVDD wafer 250 includes a polycrystalline CVDD layer 260 and a graphite substrate 270.

The polycrystalline CVDD layer 260 is grown on the graphite substrate 270 with a matched CTE. The thickness of the polycrystalline CVDD layer 260 may be approximately 250 µm. As is known by one skilled in the art, other thicknesses for the CVDD layer 260 may also be used. After growing, the polycrystalline CVDD layer 260 is cleaved from the graphite substrate 270. Metallization on the flat side of the CVDD layer 260 is performed to provide the flat side metal layer 280 for bonding to the backside metal layer 230 of the silicon wafer 200 shown in FIG. 2A. In one embodiment, the flat side metal layer 280 includes a stack of nickel (Ni) with 3 µm thickness, gold (Au) with 3 µm thickness, and tin (Sn) with 3 µm thickness. It is contemplated that other materials and different thicknesses may be used. When the CVDD wafer 250 is singulated into die as will be explained later, the flat side metal layer 280 becomes the CVDD flat side metal layer 142 shown in FIG. 1.

The CVDD wafer 250 and the silicon wafer 200 are processed separately and independently. This provides flexibility and cost efficiency in wafer processing and preparation.

Figure 3:
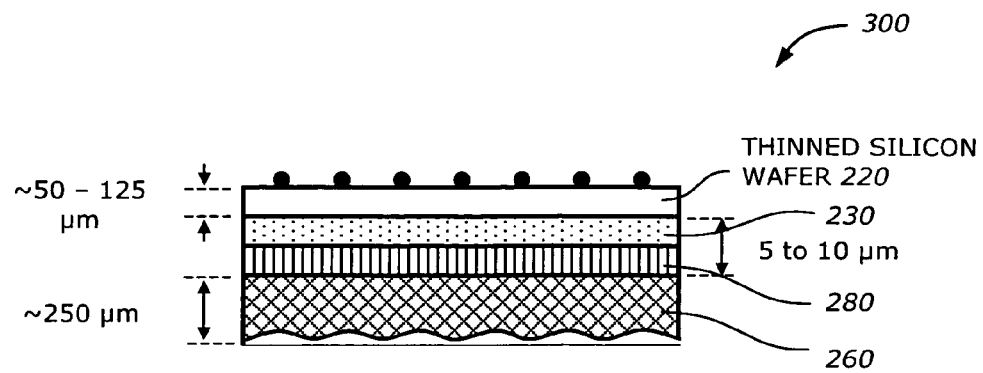
FIG. 3 is a diagram illustrating a bonded wafer according to one embodiment of the invention.

FIG. 3 is a diagram illustrating a bonded wafer 300 according to one embodiment of the invention. The bonded wafer 300 is formed by bonding the CVDD wafer 250 to the thinned silicon wafer 200. The flat side metal layer 280 of the CVDD wafer 250 is bonded to the backside metal layer 230 of the thinned silicon wafer 200. The heat spreading is efficient because the two metal layers have matched CTEs.

Figure 4:
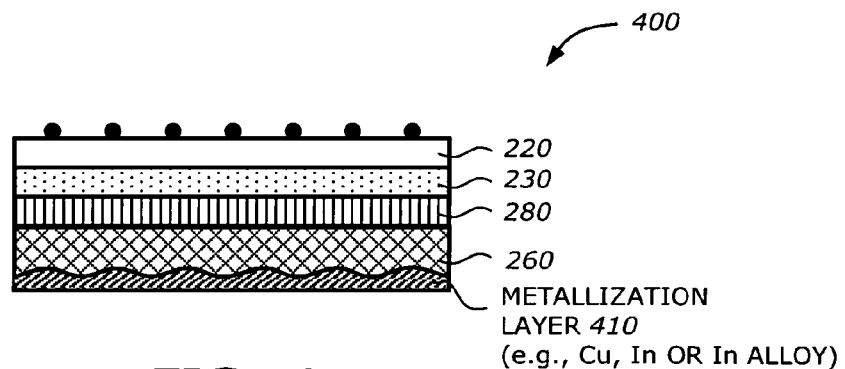
FIG. 4 is a diagram illustrating a flattened bonded wafer according to one embodiment of the invention.

FIG. 4 is a diagram illustrating a flattened bonded wafer 400 according to one embodiment of the invention.

The backside of the CVDD wafer 250 is still rough and not smooth. To flatten the surface of the rough polycrystalline diamond, a metallization layer 410 is plated on the backside of the CVDD wafer 250 and reflow is carried out. This significantly lowers the polish requirement of diamond, leading to lowered cost and increased throughput. In one embodiment, the flattening metallization material may be copper (Cu), indium (In), or In alloy with low melting temperature. The metallization on the backside of CVDD wafer 250 provides a surface to bond with other components in a system such as heat pipe and smoothes the CVDD surface.

Figure 5:
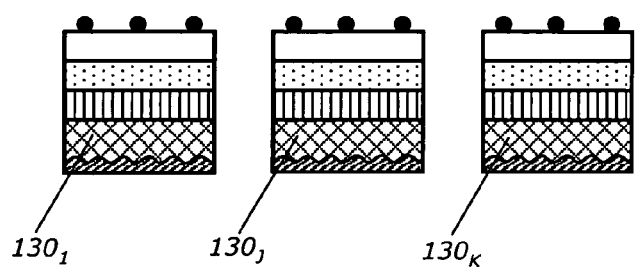
FIG. 5 is a diagram illustrating singulation of the bonded wafer according to one embodiment of the invention.

FIG. 5 is a diagram illustrating singulation of the flattened bonded wafer according to one embodiment of the invention.

After the bonded wafer is formed, flattened, and reflowed, it is singulated into individual dies $130_i$ (i=1, ..., K). In one embodiment, laser saw is used for singulation. The individual dies are attached to package substrate as shown in FIG. 1 to form a packaged device. After singulation, the CVDD wafer 250 is singulated into the CVDD spreader 150 and the silicon wafer 200 is singulated into the die 130 as shown in FIG. 1. Since the CVDD spreader 150 has the same size as the die 130, it can therefore provide efficient heat spreading. The overall thickness of the die 130, the thermal interface layer 140, and the CVDD spreader 150 is less than 400 µm, which is much lower than a plan of record (POR) silicon die alone. This provides further form factor advantage which is useful for mobile or handheld processor designs.

Figure 6:
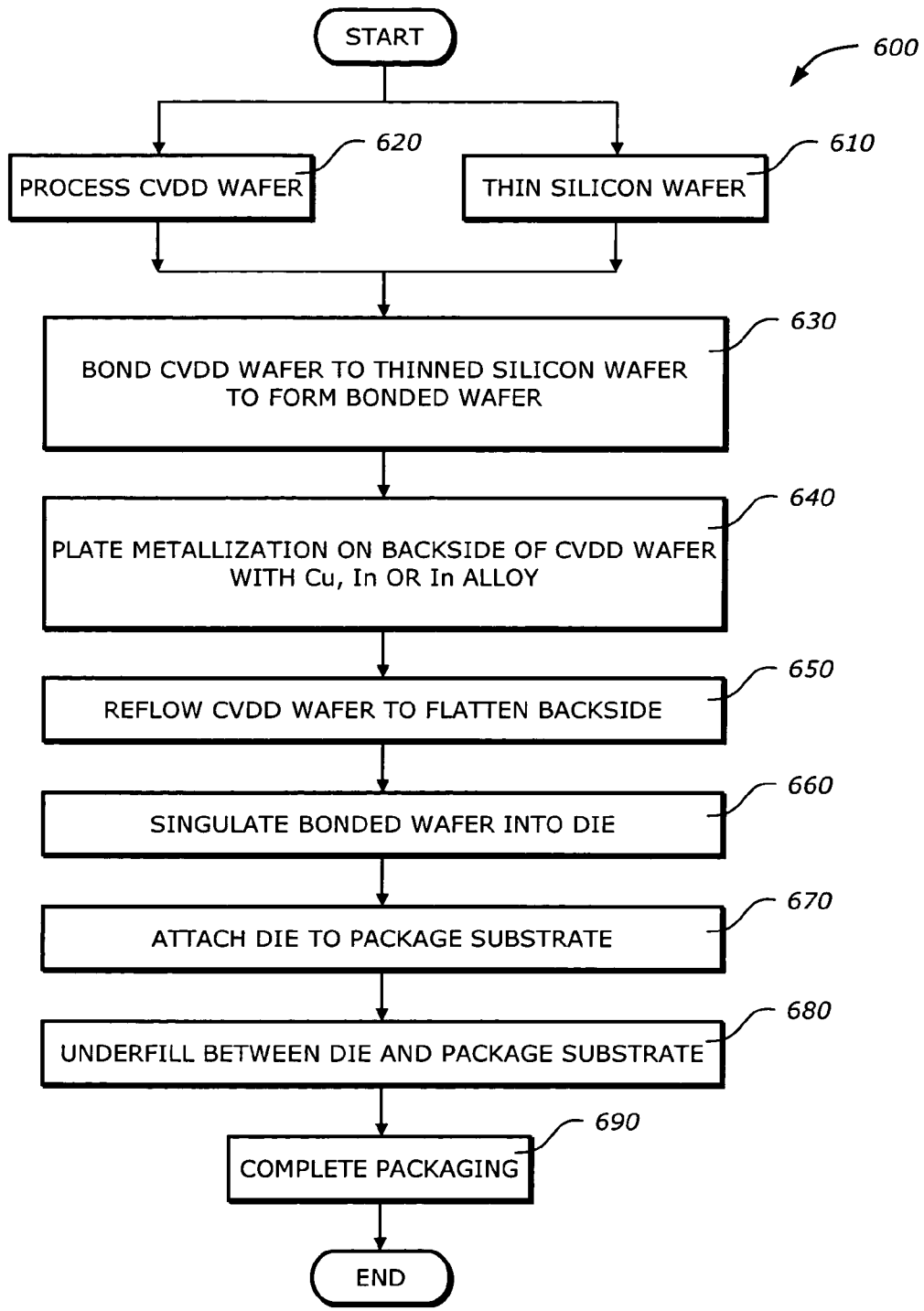
FIG. 6 is a flowchart illustrating a process to form a package device with a CVDD spreader according to one embodiment of the invention.

FIG. 6 is a flowchart illustrating a process 600 to form a package device with a CVDD spreader according to one embodiment of the invention.

Upon START, the process 600 thins a silicon wafer (Block 610) and processes a CVDD wafer (Block 620). The two procedures are performed separately and independently. Next, the process 600 bonds the CVDD wafer to the thinned silicon wafer to form a bonded wafer (Block 630).

Then, the process 600 plates metallization on the backside of the CVDD wafer (Block 640). In one embodiment, the metallization material is copper (Cu), Indium (In) or an In alloy with a low melting temperature. Next, the process 600 reflows the CVDD wafer to flatten the back side (Block 650).

Then, the process 600 singulates the bonded wafer into dies (Block 660). Next, the process 600 attaches individual dies to package substrates (Block 670). Then, the process 600 underfills the space between the dies and the package substrate (Block 680). Next, the process 600 completes the packaging such as performing a second level cooling (e.g., heat pipe and remote heat exchange) as is currently done (Block 690) and is then terminated.

Figure 7:
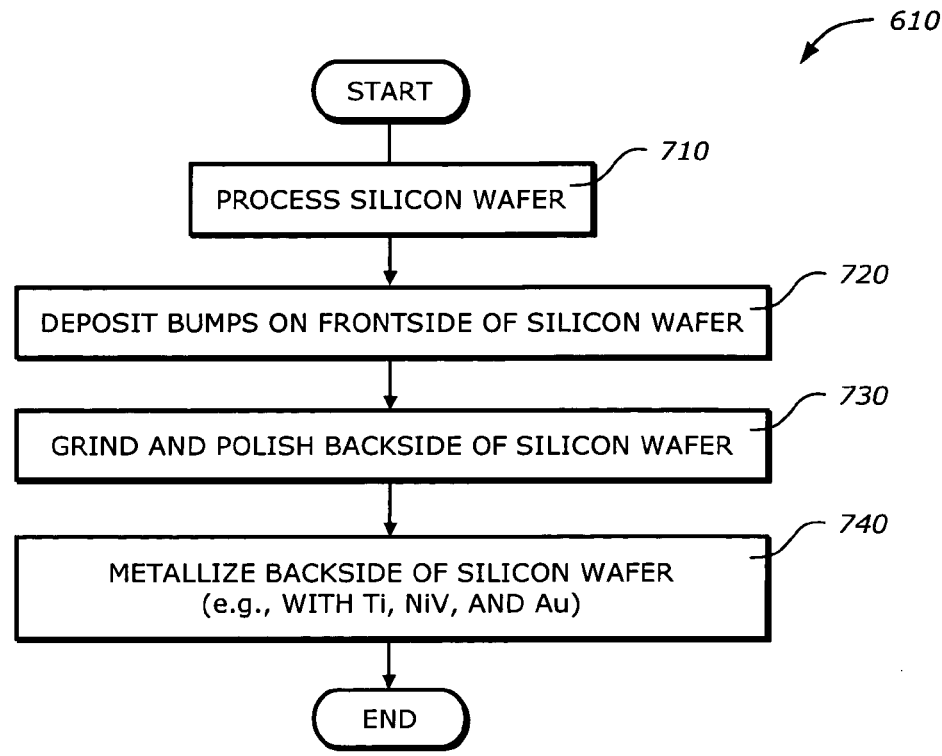
FIG. 7 is a flowchart illustrating a process to thin the silicon wafer according to one embodiment of the invention.

FIG. 7 is a flowchart illustrating the process 610 to thin the silicon wafer according to one embodiment of the invention.

Upon START, the process 610 processes the silicon wafer (Block 710) with standard processing stages such as photo masking, etching, diffusion, ion implantation, metal deposition, and passivation. Next, the process 610 deposits bumps on the front side of the silicon wafer for interconnection (Block 720). Then, the process 610 grinds and polishes the backside of the silicon wafer to thin it to a desired thickness (Block 730). In one embodiment, the thinned thickness ranges from 50 µm to 125 µm. Next, the process 610 metallizes the backside of the thinned silicon wafer (Block 710) with suitable metallization materials and thicknesses such as Ti, NiV, and Au.

Figure 8:
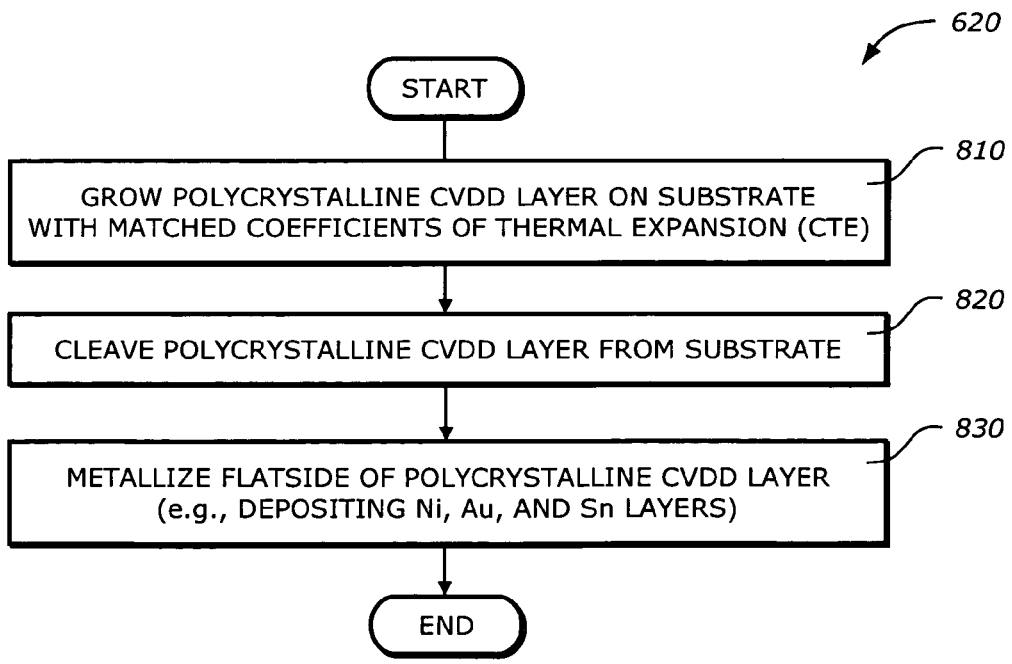
FIG. 8 is a flowchart illustrating a process to process the CVDD wafer according to one embodiment of the invention.

FIG. 8 is a flowchart illustrating the process 620 to process the CVDD wafer according to one embodiment of the invention.

Upon START, the process 620 grows a polycrystalline CVDD layer on a graphite substrate with matched CTE (Block 810). The CVDD layer may have a thickness of approximately 250 µm. Next, the process 620 cleaves the polycrystalline CVDD layer from the graphite substrate (Block 820). Then, the process 620 metallizes the flat side of the polycrystalline CVDD layer by depositing appropriate metallization materials (e.g., Ni, Au, and Sn). The process 620 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A die assembly comprising:
    a die having a die backside;
    a thermal interface layer on the die backside; and
    a chemical vapor deposition diamond (CVDD) spreader having a CVDD backside, the CVDD spreader being bonded to the die via the thermal interface layer;
    wherein the thermal interface layer comprises:
        a CVDD flat side metal layer deposited on the CVDD spreader, and
        a die backside metal layer deposited on the die backside, the die backside metal layer and the CVDD flat side metal layer having matched coefficients of thermal expansion (CTEs) and being bonded together.

2. The die assembly of claim 1 wherein the die, the thermal interface layer, and the CVDD spreader have same surface dimension.

3. The die assembly of claim 2 wherein the CVDD backside comprises:
    a flattening layer deposited on a CVDD layer.

4. The die assembly of claim 1 wherein the flattening layer comprises:
    a layer of one of copper (Cu), indium (In) and In alloy with low melting temperature.

5. The die assembly of claim 1 wherein the die has a thickness of approximately 50 to 125 microns.

6. The die assembly of claim 1 wherein the thermal interface layer has a thickness of approximately 5 to 10 microns.

7. The die assembly of claim 1 wherein the CVDD spreader has a thickness of approximately 250 microns.

8. The die assembly of claim 1 wherein the CVDD spreader has a same size with the die.

9. The die assembly of claim 2 wherein the CVDD flat side metal layer comprises:
    a stack of Ni, Au, and Sn layers.

10. The die assembly of claim 2 wherein the die backside metal layer comprises:
    a layer comprising Ti, NiV, and Au.

11. A device comprising:
    a package substrate having interconnection elements; and
    a die assembly attached to the package substrate via a plurality of bumps, the die assembly comprising:
        a die having a die backside,
        a thermal interface layer on the die backside, and
        a chemical vapor deposition diamond (CVDD) spreader having a CVDD backside, the CVDD spreader being bonded to the die via the thermal interface layer;
        wherein the thermal interface layer comprises:
            a CVDD flat side metal layer deposited on the CVDD spreader, and
            a die backside metal layer deposited on the die backside, the die backside metal layer and the CVDD flat side metal layer having matched coefficients of thermal expansion (CTEs) and being bonded together.

12. The device of claim 11 wherein the die, the thermal interface layer, and the CVDD spreader have same surface dimension.

13. The device of claim 11 wherein the CVDD backside comprises:
    a flattening layer deposited on a CVDD layer.

14. The device of claim 11 wherein the flattening layer comprises:
    a layer of one of copper (Cu), indium (In) and In alloy with low molting temperature.

15. The device of claim 11 wherein the die has a thickness of approximately 50 to 125 microns.

16. The device of claim 11 wherein the thermal interface layer has a thickness of approximately 5 to 10 microns.

17. The device of claim 11 wherein the CVDD spreader has a thickness of approximately 250 microns.

18. The device of claim 11 wherein the CVDD spreader has a same size with the die.

19. The device of claim 12 wherein the CVDD flat side metal layer comprises:
    a stack of Ni, Au, and Sn layers.

20. The device of claim 12 wherein the die backside metal layer comprises:
    a layer comprising Ti, NiV, and Au.

* * * * *

UNITED STATES PATENT AND TRADEMARK OFFICE
CERTIFICATE OF CORRECTION

PATENT NO. : 7,397,119 B2  Page 1 of 1
APPLICATION NO. : 11/295623
DATED : July 8, 2008
INVENTOR(S) : Chrysler et al.

It is certified that error appears in the above-identified patent and that said Letters Patent is hereby corrected as shown below:

In column 5, at line 29, delete "2" and insert --1--.

Signed and Sealed this

Twenty-fifth Day of November, 2008

JON W. DUDAS
*Director of the United States Patent and Trademark Office*